(12) United States Patent
Koehler et al.

(10) Patent No.: US 11,300,595 B2
(45) Date of Patent: Apr. 12, 2022

(54) ADAPTIVE CONNECTION OF RESISTIVE ELEMENTS AND TEMPERATURE-DEPENDENT RESISTIVE ELEMENTS

(71) Applicant: Hewlett-Packard Development Company, L.P., Spring, TX (US)

(72) Inventors: Duane A. Koehler, Vancouver, WA (US); Robert Yraceburu, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/259,957

(22) PCT Filed: Nov. 7, 2018

(86) PCT No.: PCT/US2018/059618
§ 371 (c)(1),
(2) Date: Jan. 13, 2021

(87) PCT Pub. No.: WO2020/096586
PCT Pub. Date: May 14, 2020

(65) Prior Publication Data
US 2021/0270875 A1   Sep. 2, 2021

(51) Int. Cl.
*G01R 19/32* (2006.01)
*G01R 19/165* (2006.01)
(Continued)

(52) U.S. Cl.
CPC ....... *G01R 19/32* (2013.01); *G01R 19/16538* (2013.01); *H05B 3/008* (2013.01); *H05B 39/02* (2013.01); *H05B 2203/032* (2013.01)

(58) Field of Classification Search
CPC .. G01R 19/32; G01R 19/16538; H05B 3/008; H05B 39/02; H05B 2203/032; G01K 7/16–28
See application file for complete search history.

(56) References Cited

U.S. PATENT DOCUMENTS 4,334,147 A    6/1982  Payne
4,762,982 A *  8/1988  Ohno ................... F02P 19/021
                                                    123/179.21
(Continued)

FOREIGN PATENT DOCUMENTS

JP           11202680    *  7/1999
JP         2000194237 A     7/2000
(Continued)

*Primary Examiner* — Tung X Nguyen
*Assistant Examiner* — Feba Pothen
(74) *Attorney, Agent, or Firm* — Brooks Cameron & Huebsch PLLC

(57) ABSTRACT

Apparatus, systems, articles of manufacture, and methods to provide an adaptive connection of a resistive element and a temperature-dependent resistive element are disclosed. An example apparatus includes a temperature-dependent resistive element. The example apparatus further includes a resistive element. The example apparatus further includes a switch coupled to the temperature-dependent resistive element and the resistive element. The example apparatus further includes a current sensor to measure a current through the temperature-dependent resistive element. The example apparatus further includes a processor to control the switch to, based on the measured current, (A) couple the temperature-dependent resistive element in parallel to the resistive element or (B) couple the temperature-dependent resistive element in series with the resistive element.

18 Claims, 5 Drawing Sheets

(51) Int. Cl.
*H05B 3/00* (2006.01)
*H05B 39/02* (2006.01)

(56) References Cited

U.S. PATENT DOCUMENTS

| | | |
|---|---|---|
| 5,986,242 A | 11/1999 | Maitani et al. |
| 6,037,757 A | 3/2000 | Oliveira et al. |
| 6,522,844 B2 | 2/2003 | Yamane et al. |
| 6,727,475 B2 | 4/2004 | Kennard et al. |
| 7,459,658 B2 | 12/2008 | Hays et al. |
| 8,744,289 B2 * | 6/2014 | Shimura ............ G03G 15/2039 399/33 |
| 2002/0012544 A1 * | 1/2002 | Yamane ................ G03G 15/205 399/69 |
| 2006/0238131 A1 | 10/2006 | Hwang |
| 2012/0076521 A1 * | 3/2012 | Ishihara ............. G03G 15/2039 399/33 |
| 2012/0148273 A1 * | 6/2012 | Shimura ............ G03G 15/2039 399/33 |
| 2014/0217087 A1 * | 8/2014 | Biller ................... H05B 1/0227 219/494 |
| 2016/0216666 A1 | 7/2016 | Iwasaki et al. |

FOREIGN PATENT DOCUMENTS

| | | |
|---|---|---|
| JP | 2001142543 A | 5/2001 |
| JP | 2002055554 A | 2/2002 |
| JP | 2006294631 A | 10/2006 |

\* cited by examiner

ADAPTIVE CONNECTION OF RESISTIVE ELEMENTS AND TEMPERATURE-DEPENDENT RESISTIVE ELEMENTS

BACKGROUND

Printers and three-dimensional manufacturing systems use high-power heating technology to power heating elements such as page dryers, fuses, and heating pressure rollers. Some heating elements include low-cost halogen lamps. Halogen lamps have resistance that varies with temperature. For example, halogen lamps have high resistance when warmed up, halogen lamps have low resistance when they are cold.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
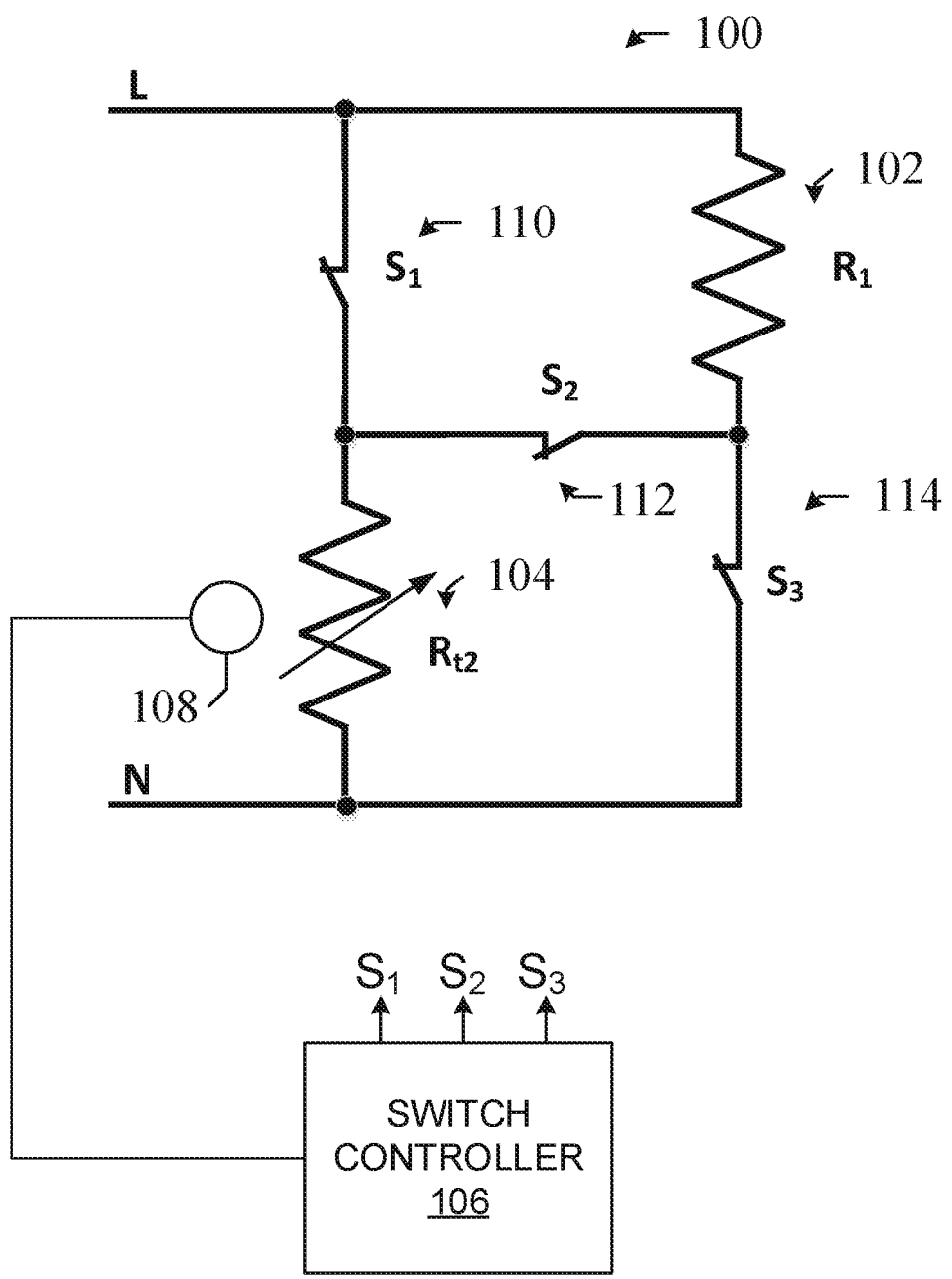
FIG. 1 is an example circuit to couple an example resistive element and an example temperature-dependent resistive element in series or in parallel/independently.

Halogen lamps are heating elements that may be used in printers, three-dimensional manufacturing systems, etc. Halogen lamps are desirable due to the low cost. However, halogen lamps, like other temperature-dependent resistive elements, have resistance that varies with temperature. Accordingly, although halogen lamps have high resistance when warmed up, halogen lamps have low resistance when they are cold. Thus, at certain points in time (e.g., during startup, after a pause in operation, etc.) when the resistance of such halogen lamps are low, operation of the halogen lamps (e.g., providing power to the halogen lamps) creates high inrush currents (e.g., a high peak current). High current peaks cause unwanted flicker, electromagnetic interference, conducted emissions (CE), harmonics, etc.

In some examples, when the temperature-dependent resistive elements are cold, AC phase control may be used until the temperature-dependent resistive element is warmed up. AC phase control corresponds to when a portion of an AC half-cycle is applied to a load. Phase control corresponds to a pulse width modulation (PWM) duty-cycle, expressed in degrees (e.g., 0 to 180, where a smaller phase angle corresponds to a smaller PWM duty-cycle). For example, during the start up of a printing operation, a small phase angle may be used to apply a lower effective power to the temperature-dependent resistive elements. In such an example, the phase angle is progressively increased over a number of half cycles until the temperature-dependent resistive elements are fully warmed. Once warm, complete AC half-cycles may be applied without causing excessively high current. However, because some temperature-dependent resistive elements have short thermal time constants, the temperature-dependent resistive elements cool down quickly, even in the middle of a printing operation. For example, for a lamp refresh cycle time of three seconds, the temperature-dependent resistive elements may cool significantly. In such an example, each time the temperature-dependent resistive elements are energized, the system enters the phase control, which may correspond to many AC cycles, thereby reducing the time available for power to be applied to other system heating elements. In this manner, the entire system warmup time is increased corresponding to a slower overall operation. Additionally, because the voltage used for phase control may be turned on in the middle of an AC cycle, the phase control causes large current load events on the power line. Such high current events can have a negative effect on conducted emissions, harmonics, electromagnetic interference, and flicker.

To reduce the inrush currents while the halogen-lamp heaters are cold, some systems (A) couple a resistive heater (e.g., that does not vary largely with temperature) to a temperature-dependent resistive element (e.g., halogen-lamp heater) in series when the temperature of the halogen-lamp heater is cold and (B) couple the resistive heater and the halogen-lamp heater in parallel when the temperature of the halogen-lamp heater is hot. In this manner, the resistance of the halogen-lamp in series with the resistive heater is large enough to reduce high current load event while the halogen-lamp is cold, and the resistance of the halogen-lamp by itself (e.g., while connected in parallel) is large enough to reduce high current load events while the halogen-lamp is hot. These techniques switch between the series connection and parallel connection based on a duration of time. However, switching between a series connection and a parallel connection based on a duration of time does not account for other factors. For example, a time-based switching protocol would need to set the switching time based on the worst case scenario, which would correspond to a longer transition time for most situations, thereby decreasing efficiency. Other techniques switch between a series connection of halogen-lamp heaters and resistive heaters to a parallel connection of halogen-lamp heaters and resistive heaters based on temperature of the halogen-lamp heaters (e.g., captured by a temperature sensor). However, switching between a series connection and a parallel connection based on a temperature is inaccurate because the temperature sensor may not be able to isolate the temperature of the halogen-lamp heaters (e.g., other components in the system may produce temperature that is included in the sensed temperature). For example, a temperature measurement does not measure the lamp temperature directly, but may measure a temperature of a belt near the lamp. Because the belt has a longer thermal time constant, the temperature sensor may indicate "warm" even though the lamp has been off and is cooled to near ambient temperature.

Examples disclosed herein switch between a series connection and a parallel/independent connection of a temperature-dependent resistive element, such as a halogen-lamp heater and a resistive heater based on a current measurement (e.g., captured by a current sensor) a resistance measurement (e.g., based on the captured current), and/or a voltage-ratio measurement (e.g., the ratio of the voltage measurement across the lamp and the full line voltage). In this manner, examples disclosed herein applies power to the loads in a series-connected configuration while monitoring the voltage ratio, for example. When the resistance of the halogen-lamp heater is low relative to the fixed resistor load, the voltage ratio will also be low. As the lamp warms, the resistance of the temperature-dependent lamp will increase by some factor (e.g., a factor of 12), thereby increasing the voltage ratio proportionally. Once the voltage ratio exceeds a predetermined threshold value, examples disclosed herein switch the loads to a parallel-connection configuration or independent control configuration. In some examples, when inferring the resistance of the temperature dependent lamp based on a current sensor measurement, the switching criteria may be based on a resistance of the lamp reaching a predetermined threshold value. In either a resistance based measurement or a voltage based measurement, applying power in a series-connected configuration when the lamp is cold will suppress high current loads. Once the map is sufficiently warmed, examples disclosed herein apply power to the loads in a parallel-connected configuration or independent control configuration to allow more power to be applied to the loads to improve overall warming time and to allow the two resistive elements to be controlled individually (e.g., not in series).

By adjusting from a series connection to a parallel or independent connection, examples disclosed herein increase the efficiency of some techniques by monitoring the current through the temperature-variable resistance element and/or determining the resistance of the temperature-variable resistance element (e.g., by a current measurement or a current and voltage ratio measurement). In this manner, a series connection may be used to reduce peak current by increasing the overall resistance of the circuit, thereby reducing inrush current. When the current decreases/the resistance increases, the series connection is no longer needed and a parallel or individually controllable connection is established. In this manner, examples disclosed herein provide a faster time to warm up the temperature-dependent resistive elements (e.g., by adjusting from series to parallel/independent quicker) and reduce flicker and CE when the peak current would be high (e.g., by adjusting from series to parallel/independent slower), corresponding to performance-based tuning. Additionally, because phase control is no longer needed, there is no need to utilize AC line filters to reduce conducted emissions and harmonics on a power line, thereby reducing cost and enabling a smaller product.

FIG. 1 illustrates an example circuit 100 that is structured to configure an example resistive element 102 and an example temperature-dependent resistive element 104 in a series configuration, in a parallel configuration and/or an independent configuration. For example, the circuit 100 may be implemented in a printer or three dimensional printing system to employ high-power heating elements. The example circuit 100 of FIG. 1 includes the example resistive element 102, the example temperature-dependent resistive element 104, an example switch controller 106, an example sensor(s) 108, and example switches 110-114. The example circuit 100 further includes nodes L and N, which may be coupled to a voltage source (e.g., an alternating current (AC) voltage source or a direct current (DC) voltage source).

The example resistive element 102 of FIG. 1 is an electrical component that implements electrical resistance to reduce current flow. The example resistive element 102 may be a heating element, such as a resistive dryer in a printer. The example temperature-dependent resistive element 104 is a resistive element that changes resistance with respect to temperature (e.g., a lower resistance at a cool, cold, or relatively lower temperature and a higher resistance at a warm, hot, or relatively higher temperature). The example temperature-dependent resistive element 104 may be a heating element, such as a halogen lamp, a tungsten-halogen lamp, etc., in a printer. The resistance of the resistive element 102 is some resistance higher than the resistance of the temperature-dependent resistive element 104, when the temperature-dependent resistive element 104 is cold (e.g., cool, ambient temperature, and/or below a threshold temperature). In some examples, the resistive element 102 may be coupled to the temperature-dependent resistive element 104 in series. In some examples, the resistive element 102 may be coupled from node L to node N, bypassing the temperature-dependent resistive element 104 based on the control of the example switches 110-114. In some examples, the resistive element 102 may be bypassed. When the example resistive element 102 is coupled to the example temperature-dependent resistive element 104 in series, and the resistance of the temperature-dependent resistive element 104 is low, the power applied to the temperature-dependent resistive element 104 will be low because the current is limited to a moderate value due to the high resistance of the example resistance element 102. Accordingly, most of the power of the circuit 100 is applied to the resistive element 102, thereby assisting in warming up the temperature-dependent resistive element 104 faster (e.g., because the resistive element 104 has a low resistive thermal coefficient).

The example switch controller 106 of FIG. 1 controls the example switches 110-114 by transmitting a control signal or multiple control signals to the switches 110-114 to enable and/or disable particular switches 110-114. For example, the switch controller 106 may transmit a first signal or first signals to the example switch S2 112 to enable the switch S2 112 and transmit a second signal or second signals to the example switches S1, S3 110, 114 to disable the example switches S1, S3 110, 114, thereby coupling the example resistive element 102 with the example temperature-dependent resistive element 104 in series (e.g., the current flowing from the L node to the N node through the resistive element 102, the switch S2 112, and the temperature-dependent resistive element 104). Additionally, the example switch controller 106 may transmit a signal or multiple signals to enable the switch S3 114 and disable the switches S1, S2, 110, 112 to apply power to just the resistive element 102 (e.g., bypassing the example temperature-dependent resistive element 104). Additionally, the example switch controller 106 may transmit a signal or multiple signals to disable the switches S2, S3 112, 114 and enable the switch S1, 110 to apply power to just temperature-dependent resistive element 104 (e.g., bypassing the resistive element 102). Additionally, the example switch controller 106 may transmit a signal or multiple signals to disable the switch S2 112 and enable the switches S1, S3, 110, 114 to apply power to both the temperature-dependent resistive element 104 and the example resistive element 102 at the same time, in parallel. In this manner, the two loads can be connected one at a time, or together in series, or together in parallel. In some examples, when the switch controller 106 configures the circuit 100 in parallel, the switch controller 106 may toggle control between powering just the resistive element 102 and powering just the temperature-dependent resistive element 104 (e.g., based on preset instructions and/or instructions from another processor).

As described above, when the example temperature-dependent resistive element 104 is cooler, the resistance is lower. Accordingly, below some threshold, the peak current that flows through the example temperature-dependent element 104 may be high enough to cause undesirable results (e.g., flicker, CE, etc.). Accordingly, the example switch controller 106 couples the temperature-dependent element 104 to the resistive element 102 in series to increase the overall resistance between node L and node N, thereby reducing the peak current. Initially (e.g., during startup, when a print operation begins, etc.), the example switch controller 106 controls the switches 110-114 to couple the resistive elements 102, 104 in series. However, while powered, the temperature-dependent resistive element 104 begins to warm up and the resistance increases. Accordingly, the example switch controller 106 may infer the resistance of the temperature-dependent resistance element 104 based on the known input voltage, the known resistance of the example resistance element 102, and a known current (e.g., using Ohm's law). The current corresponds to a measured current from the example sensor(s) 108. The example switch controller 106 switches from the series configuration to the parallel configuration or an independent configuration (e.g., where the resistance element 102 or the temperature-dependent resistive element 104 may be powered individually), based on the inferred resistance of the temperature-dependent resistive element 104. In some examples, the switch controller 106 may switch between the series configuration to the parallel configuration or an independent configuration based on the measured current. In some examples, the switch controller 106 may switch between the series configuration to a parallel or independent configuration based on a measured voltage. Additionally, when the current gets too high or otherwise exceeds a threshold and/or the resistance of the temperature-dependent resistive element 104 gets too low or otherwise exceeds a threshold, the example switch controller 106 switches back from the parallel or independent configuration to the series configuration to reduce the current.

The example sensor(s) 108 of FIG. 1 may be a current sensor that senses (e.g., measures or obtains) current through the example temperature-dependent resistive element 104. The sensor(s) 108 transforms the current measurement into an electrical signal (e.g., a voltage) representative of a current value. In this manner, the switch controller 106 can determine the current based on the electrical signal. The sensor(s) 108 may be located in other positions, so long as the sensor(s) 108 can obtain the current that flows through the example temperature-dependent resistive element 104. In some examples, the sensor(s) 108 is a voltage sensor that measures the voltage across the temperature-dependent resistive element 104. In some examples, the sensor(s) 108 includes a current sensor and a voltage sensor.

The example switches 110-114 of FIG. 1 are electrical components that (A) create a short to connect the two terminals of the switch when enabled and (B) create an open circuit to disconnect the two terminals of the switch when disabled. In some examples, the switches 110-114 are enabled and/or disabled based on a voltage and/or current applied to the switches 110-114. For example, if the switches 110-114 are triode for AC (TRIAC) switches, the switches 110-114 can be enabled when the switch controller 106 applies a high voltage to the gate of the switches 110-114 and can be disabled when the switch controller 106 applies a low voltage to the gate of the switches 110-114. Additionally or alternatively, the example switches 110-114 can be n-channel metal oxide semiconductor (MOS) field effect transistors (FET) (NMOSs), p-channel MOSFETs (PMOSs), and/or any other type of switch.

Figure 2:
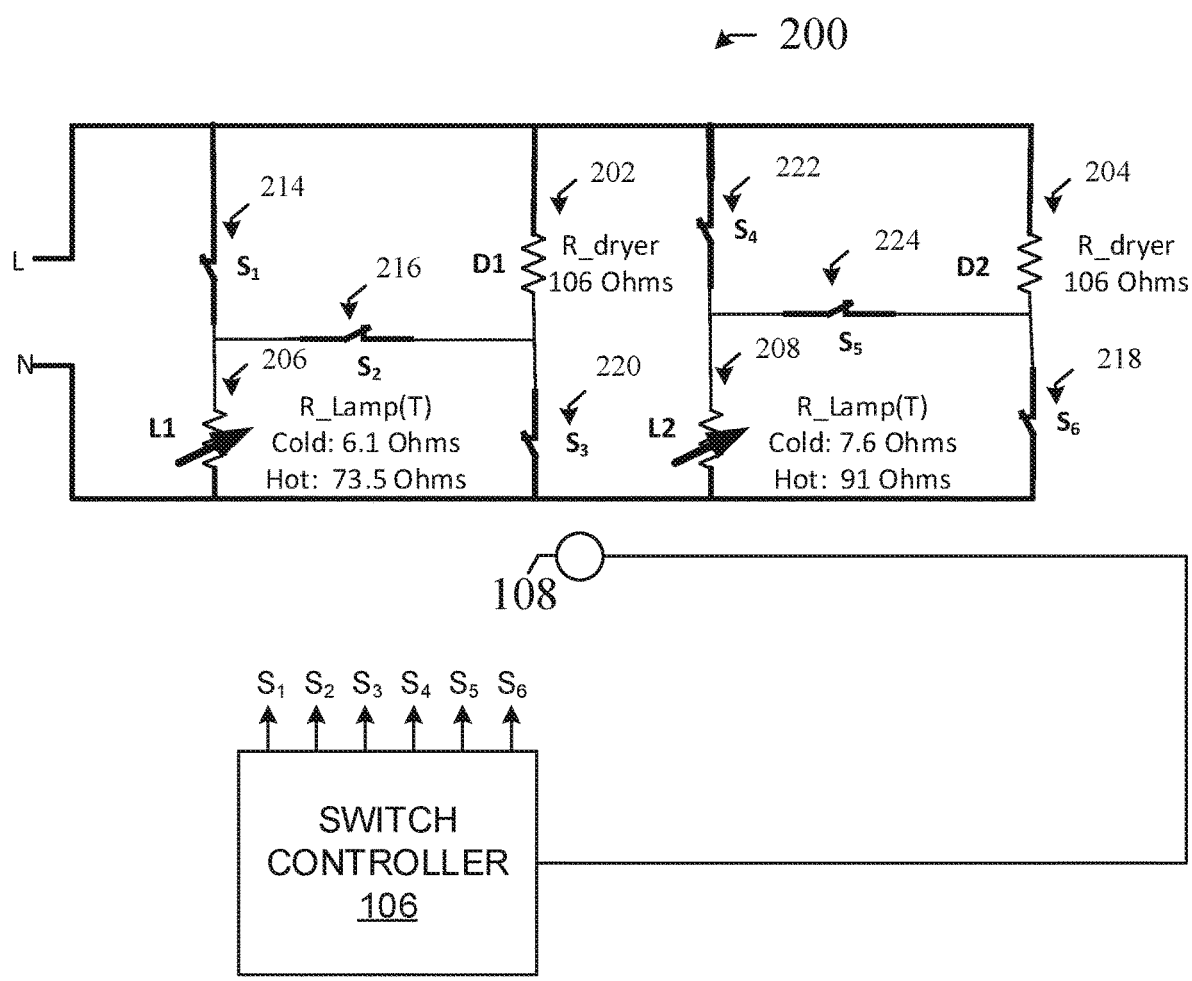
FIG. 2 is an alternative example circuit to couple example resistive elements and example temperature-dependent resistive elements in series or in parallel/independently.

FIG. 2 illustrates an alternative example circuit 200 that is structured to couple example resistive elements 202, 204 and example temperature-dependent resistive elements 206, 208 in series and/or in parallel or independently. For example, the circuit 200 may be implemented in a printer or three dimensional printing system to employ high-power heating elements. The example circuit 200 of FIG. 2 includes the example switch controller 106 and the example sensor(s) 108 of FIG. 1. The example circuit 200 further includes the example resistive elements 202, 204, the example temperature-dependent resistive elements 206, 208, and example switches 214-224. Although the alternative example circuit 200 includes two resistive elements 202, 204 and two temperature-dependent resistive elements 206, 208, the example circuit 200 may be scaled to include any number of resistive element and/or any number of temperature-dependent resistive elements that may be coupled in series, in parallel, and/or independently based on a measured current or multiple measured currents.

The example circuit 200 of FIG. 2 includes two resistive elements 202, 204 and two temperature-dependent resistive elements 206, 208. Accordingly, during a series configuration, the example resistive element 202 may be coupled to the example temperature-dependent resistive element 206 in series or the example resistive element 204 may be coupled to the example temperature-dependent resistive element 208 in series. For example, the switch controller 106 may toggle between the two series connections (e.g., by enabling and disabling particular switches 214-224) until the example sensor(s) 108 obtains a current that satisfies/exceeds a threshold (e.g., is below a minimum current threshold), at which point the example switch controller 106 switches to a parallel configuration and/or an independent configuration. The parallel/independent configuration may correspond to configuring the example switches 214-224 in variation combinations, as shown below in Table 1. The example switch controller 106 may enable the particular parallel configuration, independent configuration, and/or combination of parallel configurations and/or independent configurations (e.g., which the switch controller 106 may toggle between) based on preset instructions or instructions from another processor. The below Table 1 illustrates the switches 214-224 that are enabled for the corresponding modes.

TABLE 1

Control Modes with corresponding switch control, peak current, lamp power, and dryer power.

| mode | $S_1$ | $S_2$ | $S_3$ | $S_4$ | $S_5$ | $S_6$ | Cold Current RMS (A) | TD Resistor Power RMS (W) | Resistor Power RMS (W) |
|---|---|---|---|---|---|---|---|---|---|
| $R_{T3}$ (cold) | x | | | | | | 37.6 | 8640 | |
| $R_{T3}$ (hot) | x | | | | | | 3.1 | 720 | |
| $R_1$ | | | x | | | | 2.2 | | 500 |
| $R_1$ and $R_{T3}$ (cold-parallel) | x | | x | | | | 39.7 | 8640 | 500 |
| $R_1$ and $R_{T3}$ (hot-parallel) | x | | x | | | | 5.3 | 720 | 500 |
| $R_1$ and $R_{T3}$ (cold-series) | | x | | | | | 2.1 | 26 | 447 |
| $R_1$ and $R_{T3}$ (hot-series) | | x | | | | | 1.3 | 121 | 174 |
| $R_{T4}$ (cold) | | | | x | | | 30.3 | 6960 | |
| $R_{T4}$ (hot) | | | | x | | | 2.5 | 580 | |
| $R_2$ | | | | | | x | 2.2 | | 500 |
| $R_2$ and $R_{T4}$ (cold-parallel) | | | | x | | x | 32.4 | 6960 | 500 |
| $R_2$ and $R_{T4}$ (hot-parallel) | | | | x | | x | 4.7 | 580 | 500 |

TABLE 1-continued

Control Modes with corresponding switch control, peak current, lamp power, and dryer power.

| mode | $S_1$ | $S_2$ | $S_3$ | $S_4$ | $S_5$ | $S_6$ | Cold Current RMS (A) | TD Resistor Power RMS (W) | Resistor Power RMS (W) |
|---|---|---|---|---|---|---|---|---|---|
| $R_2$ and $R_{T4}$ (cold-series) | | | | x | | | 2.0 | 31 | 435 |
| $R_2$ and $R_{T4}$ (hot-series) | | | | x | | | 1.2 | 124 | 144 |
| $R_1$ and $R_2$ (parallel) | | x | | | x | | 4.3 | | 1000 |
| $R_{T3}$ and $R_{T4}$ (cold-parallel) | x | | x | | | | 67.8 | 15600 | |
| $R_{T4}$ and $R_{T4}$ (hot-parallel) | x | | x | | | | 5.7 | 1300 | |

In the above Table 1, 'x' corresponds to the switch being enabled, 'A' represents amperes, 'W' represents Watts, and 'TD' represents temperature dependent, where the input voltage is 230 V (AC), the resistive elements are resistive elements with resistor power ratings of 500 Watts and resistances of 106 Ohms, the example first temperature dependent resistive element 206 is a 720 W halogen lamp with a 12:1 hot to cold resistance ratio, and the example second temperature dependent resistive element 208 is a 580 W halogen lamp with a 12:1 hot to cold resistance ratio. As shown in the above table 1, any independent configuration or parallel configuration of the temperature dependent resistive elements 206, 208 when cold results in a large amount of current (e.g., above 30 Amps), resulting in a large amount of drawn power. Accordingly, the example switch controller 106 does not configure the temperature dependent resistive elements 206, 208 in an independent configuration or a parallel configuration during startup (e.g., when the temperature dependent resistive elements 206, 208 are cold). Instead, the example switch controller 106, when during start up, configures the 200 in one of the series configurations of Table 1 and may adjust to a parallel configuration and/or independently controllable configuration after the temperature-dependent resistive elements 206, 208 have warmed up (e.g., based on a current/voltage/resistive comparison to a threshold).

Figure 3:
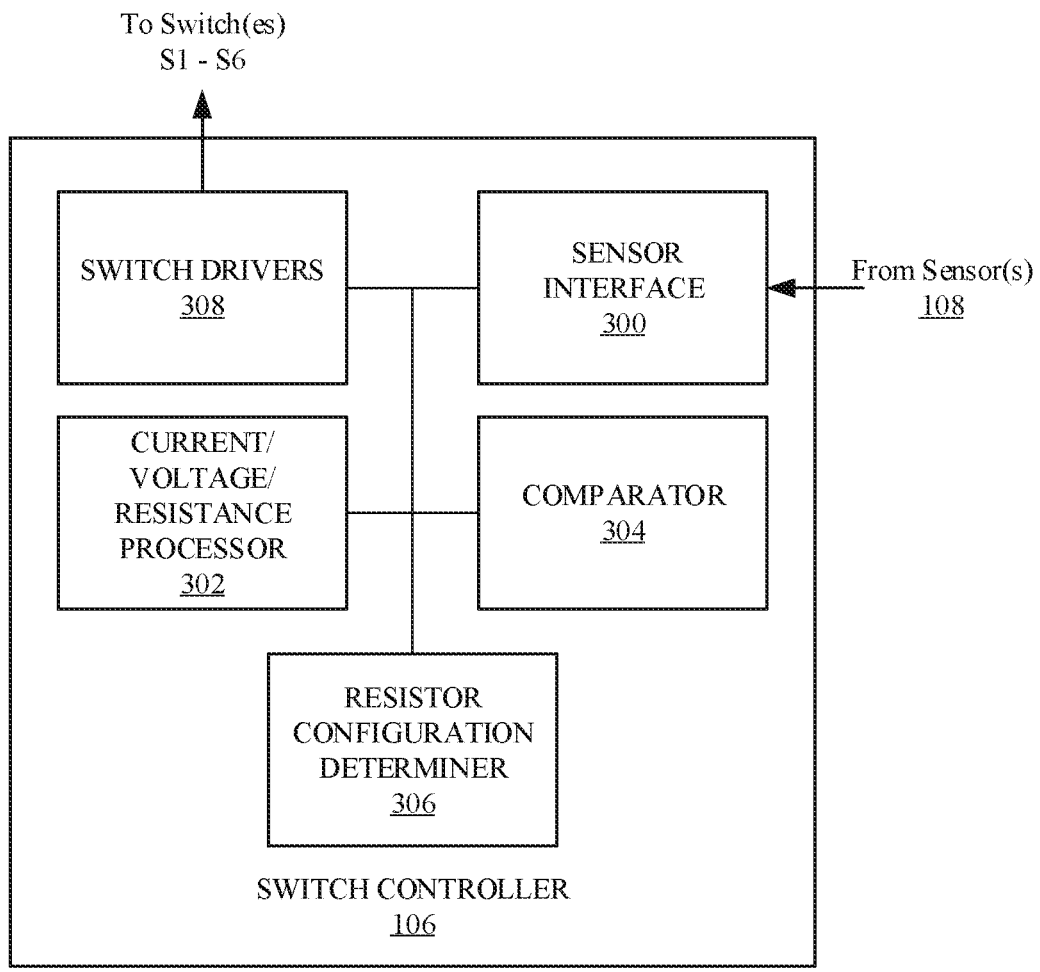
FIG. 3 is a block diagram of an example switch controller of the example circuit of FIG. 1

FIG. 3 is an example implementation of a block diagram of the example switch controller 106 of FIGS. 1 and/or 2. The example switch controller 106 includes an example sensor(s) interface 300, an example current/voltage/resistance processor 302, an example comparator 304, and an example resistor configuration determiner 306, and example switch drivers 308.

The example sensor(s) interface 300 of FIG. 3 obtains an electrical signal from the example sensor(s) 108. As described above the electrical signal corresponds to an amount of current that is flowing though the example temperature-dependent resistive elements 104, 206, 208 and/or a voltage across any one of the example temperature-resistive elements 104, 206, 208 of FIGS. 1 and/or 2. In some examples, the sensor(s) interface 300 may receive electrical signals from many sensors. The example sensor(s) interface 300 forwards the received electrical signal to the example current/voltage/resistance processor 302.

The example current/voltage/resistance processor 302 of FIG. 3 determines the current through any one of the temperature-dependent resistance elements 104, 206, 208 based on the electrical signal from the example sensor(s) 108 by converting the electrical signal (e.g., a voltage) into a current value. In some examples, the current/voltage/resistance processor 302 may determine (e.g., infer) the resistance of one of the temperature-dependent resistive elements 104, 206, 208 and/or many of the resistive elements 104, 206, 208 based on the determined current and/or electrical signal. For example, based on Ohm's law, if the current and voltage are known, the resistance can be determined (e.g., R=V/I). Because the resistance of the example resistive element 102 and/or the resistances of the resistive elements 202, 204 are known and the voltage between node L and N are known, the current/voltage/resistance processor 302 can determine the voltage across any one of the temperature-dependent resistive elements 104, 206, 208 and use Ohm's law to determine the resistance of the corresponding temperature-dependent resistive elements 104, 206, 208. In some example, the example current/voltage/resistance processor 302 determines a voltage ratio between the voltage across any one of the temperature-dependent resistive elements 104, 204, 206 and the full line voltage (e.g., the voltage applied to the L node). As described above, the voltage ratio corresponds proportionally to the resistance of the temperature-dependent resistive elements 104, 204, 206.

The example comparators 304 of FIG. 3 compares the determined current, voltage ratio and/or resistance to a threshold (e.g., a current threshold, a voltage ratio threshold, or a resistance threshold). When the threshold is a resistance threshold, the resistance threshold corresponds to a predetermined resistance value. The predetermined resistance value corresponds to minimum amount of resistance needed by the example temperature-dependent resistive element 104, 206, 208 to sufficiently reduce any potential peak current below a current that causes undesirable results without being coupled in series to another resistive element. For example, if the amount of resistance to sufficiently suppress inrush current to an appropriate level is 100 Ohms, then the threshold is set to a value corresponding to 100 Ohms. In this manner, when the comparator 304 compares the determined resistance of the temperature-dependent resistive element 104, 206, 208 to the threshold, if the determined resistance is lower than the threshold, the comparator 304 outputs a first value (e.g., corresponding to a series connection) and if the determined resistance is higher than the threshold, the comparator 304 outputs a second value (e.g., corresponding to a parallel connection or independent connection). In some examples, when the signal from the sensor(s) 108 is a voltage, the comparator 304 may compare the voltage from the sensor(s) 108 with a preset threshold voltage representative of the current/resistance threshold (e.g., thereby performing a comparison without translating the electrical signal into a current or resistance).

When the comparator 304 of FIG. 3 is a current-based comparator, the threshold is a current threshold corresponding to a predetermined current value. The predetermined resistance value corresponds to an amount of current through the example temperature-dependent resistive element 104, 206, 208 to flag a switch from a series connection to a parallel or independent connection. For example, initially, the switch controller 106 transmits a signal or multiple signals to configure the resistive elements (e.g., the example resistive elements 102, 202, 204) in series with the temperature-dependent resistive elements (e.g., the example temperature-dependent resistive elements 104, 206, 208). In such an example, the series connection provides sufficient resistance to keep the inrush current below an unacceptable current level. However, as the temperature-dependent resistive element warms up, the resistance increases to cause the current to decrease too low. Accordingly, when the comparator 304 determines that the current is too low (e.g., below the current threshold), the comparator 304 outputs the second value (e.g., corresponding to a parallel connection or independent connection). Otherwise, when the current is above the current threshold, the comparator 304 outputs the first value (e.g., corresponding to a series connection). Because during startup and/or after the initiation of a series configuration, the current is or may be zero, the initial current based comparison may be performed after a preset delay, to avoid switching between a parallel/independent connection and a series connection during startup, when the current is naturally low and initially increasing.

When the comparator 304 of FIG. 3 is a voltage ratio based threshold, the threshold is a voltage ratio threshold corresponding to a predetermined voltage ratio value. The predetermined voltage ratio value corresponds to an amount of voltage ratio between the voltage across the example temperature-dependent resistive element 104, 206, 208 to the full line voltage to flag a switch from a series connection to a parallel/independent connection. For example, initially, the switch controller 106 transmits a signal or multiple signals to configure the resistive elements (e.g., the example resistive elements 102, 202, 204) in series with the temperature-dependent resistive elements (e.g., the example temperature-dependent resistive elements 104, 206, 208). In such an example, the series connection provides sufficient resistance to keep the inrush current below an unacceptable current level. However, as the temperature-dependent resistive element warms up, the resistance increases to cause the current to decrease too low. Accordingly, when the comparator 304 determines that the voltage ratio is too high (e.g., above the voltage ratio threshold), the comparator 304 outputs the second value (e.g., corresponding to a parallel connection or independent connection). Otherwise, when the voltage ratio is below the voltage ratio threshold, the comparator 304 outputs the first value (e.g., corresponding to a series connection).

The example resistor configuration determiner 306 of FIG. 3 determines how to configure the example switches 110-114, 214-224 based on the output of the comparator 304. For example, initially the resistor configuration determiner 306 selects a series configuration of the resistive elements 102, 202, 204 and the temperature-dependent resistive elements 104, 206, 208. After startup, the example resistor configuration determiner 306 switches between the series connection to a parallel connection or an independent connection (e.g., where any one or combination of the resistive elements 102, 202, 204 and/or the temperature-dependent resistive elements 104, 206, 208 can be controlled in parallel or individually) based on the output of the comparator 304. In some examples, the resistor configuration determiner 306 can be implemented by a lookup table that receives an input from the comparator 304 and outputs a configuration corresponding to the input and/or other instructions from another processor. As described above in conjunction with FIG. 2, another processor or preset instructions may instruct the switch controller 106 to toggle between different series connections or parallel connections and/or independent connections within a particular series/parallel/independent mode. Accordingly, the example resistor configuration determiner 306 may toggle between different connections within a particular series/parallel mode/independent mode based on such instructions.

The example switch drivers 308 of FIG. 3 output a signal or multiple signals (e.g., voltages) to the switches 110-114, 214-224 to enable or disable (e.g., turn on or off) the switches 110-114, 214-224 based on the selected resistor configuration from the resistor configuration determiner 306. For example, if the resistor configuration determiner 306 determines that the example resistive element 204 and the example temperature-dependent resistive element 208 should be coupled in series, the example switch drivers 308 transmit a first voltage (e.g., a high voltage) to the example switch 224 to enable the switch 224 and transmits a second voltage (e.g., a low voltage) to the example switches, 214, 216, 218, 220, 222 to disable the switches, 214, 216, 218, 220, 222.

While an example manner of implementing the example switch controller 106 of FIG. 1 is illustrated in FIG. 3, one, some, or all of the elements, processes and/or devices illustrated in FIG. 3 may be combined, divided, re-arranged, omitted, eliminated and/or implemented in any other way. Further, the example sensor(s) interface 300, the example current/voltage/resistance processor 302, the example comparator 304, the example register configuration determiner 306, the example switch drivers 308, and/or, more generally, the example switch controller 106 of FIG. 3 may be implemented by hardware or machine readable instructions including software and firmware and/or any combination of hardware, software and/or firmware. Thus, for example, any of the example sensor(s) interface 300, the example current/voltage/resistance processor 302, the example comparator 304, the example register configuration determiner 306, the example switch drivers 308, and/or, more generally, the example switch controller 106 of FIG. 3 could be implemented by an analog or digital circuit(s) or multiple analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, the example sensor(s) interface 300, the example current/voltage/resistance processor 302, the example comparator 304, the example register configuration determiner 306, the example switch drivers 308, and/or, more generally, the example switch controller 106 of FIG. 3 is/are hereby expressly defined to include a non-transitory computer readable storage device or storage disk such as a memory, a digital versatile disk (DVD), a compact disk (CD), a Blu-ray disk, etc. including the software and/or firmware. Further still, the example switch controller 106 of FIG. 3 may include elements, processes and/or devices in addition to, or instead of, those illustrated in FIG. 3, and/or may include more than one of any or all of the illustrated elements, processes and devices. As used herein, the phrase "in communication," including variations thereof, encompasses direct communication and/or indirect communication through an intermediary component or multiple intermediary components, and does not require direct physical (e.g., wired) communication and/or constant communication, but rather additionally includes selective communication at periodic intervals, scheduled intervals, aperiodic intervals, and/or one-time events.

Figure 4:
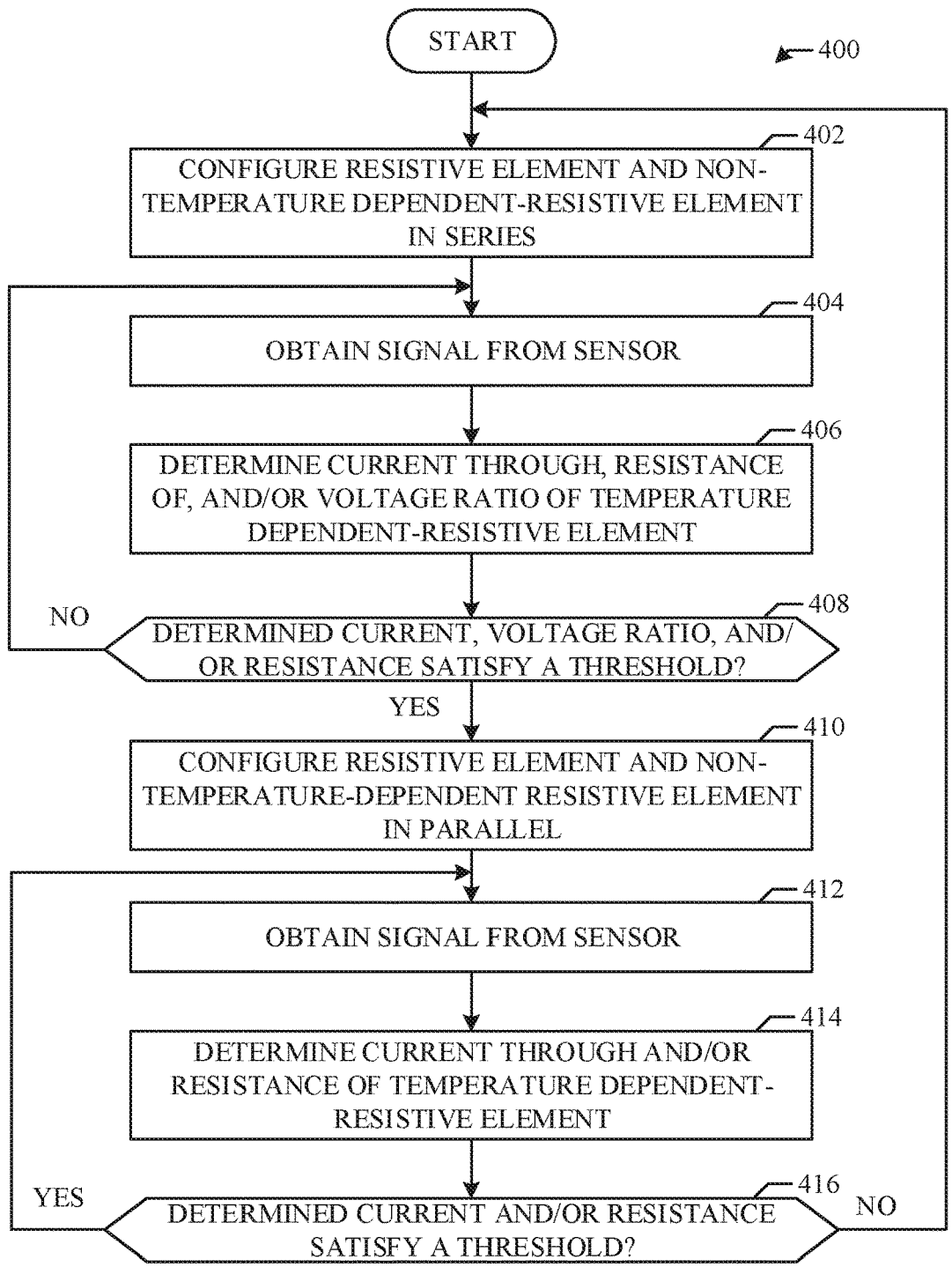
FIG. 4 is a flowchart representative of machine readable instructions which may be executed to implement the example switch controller of FIG. 3.

A flowchart representative of example hardware logic, machine readable instructions, hardware implemented state machines, and/or any combination thereof for implementing the switch controller 106 of FIG. 1 is shown in FIG. 4. The machine readable instructions may be an executable program or portion of an executable program for execution by a computer processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIG. 4, many other methods of implementing the example switch controller 106 may alternatively be used. For example, the order of execution of the blocks may be changed, and/or some of the blocks described may be changed, eliminated, or combined. Additionally or alternatively, any or all of the blocks may be implemented by a hardware circuit or multiple hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As disclosed above, the example process of FIG. 4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

FIG. 4 is an example flowchart 400 representative of example machine readable instructions that may be executed by the example switch controller 106 of FIG. 3 to determine switching between a series configuration and a parallel configuration or an independent configuration. The flowchart 400 of FIG. 4 is initiated at startup and/or after an inactive mode (e.g., sleep mode). Although the flowchart 400 of FIG. 4 is described in conjunction with the example circuits 100 of FIG. 1, the flowchart 400 may be described in conjunction with any type of resistive circuit (e.g., including the example circuit 200 of FIG. 2).

At block 402, the example switch drivers 308 configure the resistive element 102 and the example temperature-dependent resistive element 104 in a series configuration. For example, the switch drivers 308 transmit a first voltage to the example switch 112 to enable the example switch 112 and transmit a second voltage to the example switches 110, 114 to disable the example switches 110, 114.

At block 404, the example current/voltage/resistance processor 302 obtains a signal from the example sensor(s) 108 via the sensor(s) interface 300. The signal may correspond to a sensed current through the temperature-dependent resistive element(s) 104, 204, 206 and/or a voltage across one of the temperature dependent resistive elements(s) 104, 204, 206 or multiple of the temperature dependent resistive elements 104, 204, 206. At block 406, the example current/voltage/resistance processor 302 determines the current through the temperature dependent resistive element(s) 104, 204, 206, the resistance of the temperature dependent resistive element(s) 104, 204, 206 and/or a voltage ratio (e.g., corresponding to the full line voltage and the voltage across one of the temperature-dependent resistive elements 104, 204, 206 or multiple of the temperature-dependent resistive elements 104, 204, 206) based on the signal from the sensor(s) 108. For example, if the electrical signal is a voltage representative of a current value, the current/voltage/resistance processor 302 determines the current value based on the voltage.

At block 408, the example comparator 304 determines if the determined current, resistance, and/or voltage ratio satisfies/exceeds a threshold. For example, the comparator 304 compares the determined current, resistance, and/or voltage ratio to a current, resistance, and/or voltage ratio threshold to determine if the current is too high, the resistance is too low, and/or the voltage ratio is too low (e.g., doesn't satisfy/exceeds the threshold) or acceptable (e.g., satisfies/exceeds the threshold). In some examples, when the comparator 304 performs a current-based threshold comparison, a delay may be implemented to avoid comparing the initial rising current during startup and/or after the initiation of a series configuration. In some examples, the comparator 304 compares the current signal or voltage signal directly from the sensor(s) 108 to a signal representative of the threshold to determine if the current satisfies/exceeds a threshold or the voltage ratio satisfies/exceeds the threshold.

If the example comparator 304 determines that the determined current, resistance, and/or voltage ratio does not satisfy/exceed a threshold (e.g., the determined current is above a current threshold, the resistance is below a resistance threshold, or the voltage ratio is ratio is below a voltage ratio threshold) (block 408: NO), the process returns to block 404, thereby maintaining a series configuration. If the example comparator 304 determines that the determined current, resistance, and/or voltage ratio satisfies/exceeds the threshold (e.g., the determined current is below the current threshold, the determined resistance is above the resistance threshold, or the voltage ratio is above a voltage ratio threshold) (block 408: YES), the example resistor configuration determiner 306 triggers the switch drivers 308 to configure the resistive element 102 and the example temperature-dependent resistive element 104 in a parallel or independent configuration (block 410). For example, in a parallel configuration, the resistor configuration determiner 306 may instruct the example switch drivers 308 to (a) transmit a first voltage to enable the example switches 110, 114 and transmit a second voltage disable the example switch 112 to apply power to in parallel. In another example, resistor configuration determiner 306 may instruct the example switch drivers 308 to operate the resistive element 102 or the example temperature-dependent resistive element 104 in an independent configuration.

At block 412, the example current/voltage/resistance processor 302 obtains a signal from the example sensor(s) 108 via the sensor(s) interface 300. At block 414, the example current/voltage/resistance processor 302 determines the current through the temperature dependent resistive element(s) 104, 204, 206 and/or the resistance of the temperature dependent resistive element(s) 104, 204, 206 based on the signal from the sensor(s) 108. For example, if the electrical signal is a voltage representative of a current value, the current/voltage/resistance processor 302 determines the current value based on the voltage. At block 416, the example comparator 304 determines if the determined current and/or resistance satisfies/exceeds a threshold. In some examples, the comparator 304 compares the current/voltage signal directly from the sensor(s) 108 to a signal representative of the threshold to determine if the current/voltage ratio satisfies/exceeds a threshold.

If the example comparator 304 determines that the determined current and/or resistance does not satisfy/exceed a threshold (e.g., the determined current is above a current threshold or the resistance is below a resistance threshold) (block 416: NO), the process returns to block 402 to configure the resistive element 102 and the temperature-dependent resistive element 104 in a series configuration. If the example comparator 304 determines that the determined current or resistance satisfies/exceeds the threshold (block 416: YES), the process returns block 412, thereby maintaining the parallel or independent configuration.

Although the flowchart 400 of FIG. 4 is described in conjunction with a determination of a series configuration, parallel configuration, and/or independent configuration based on a current measurement, an inferred resistance determination, and/or a voltage ratio, some examples may use different measurements for different configurations. For example, a voltage ratio measurement/determination may be used to switch from a series configuration to a parallel/independent configuration and current measurement may be used to switch while in the parallel/independent configuration based on user and/or manufacturer preferences.

Figure 5:
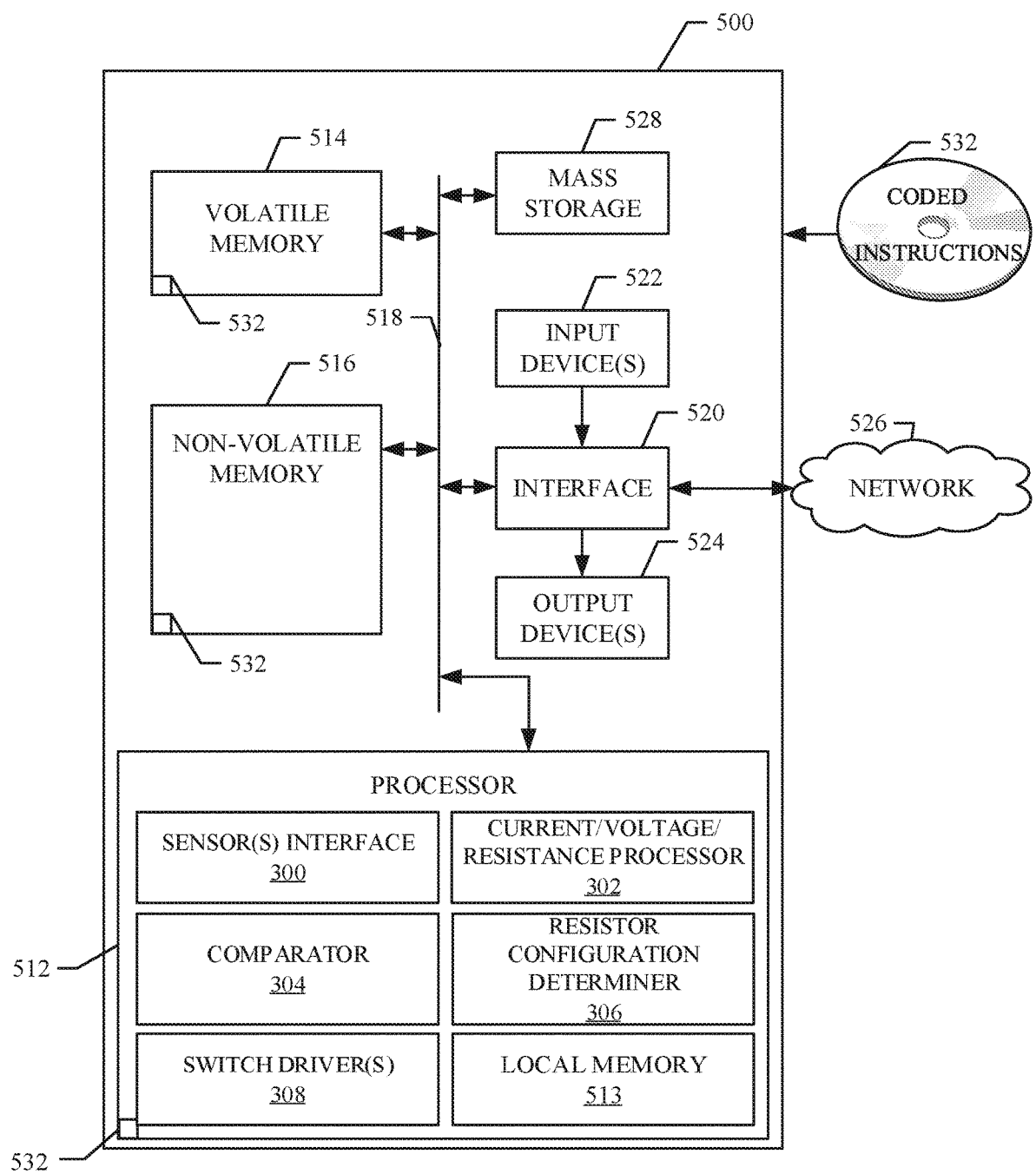
FIG. 5 is a block diagram of an example processing platform structured to execute the instructions of FIG. 4 to implement the example switch controller of FIG. 3.

FIG. 5 is a block diagram of an example processor platform 500 structured to execute the instructions of FIG. 4 to implement the switch controller 106 of FIG. 3. The processor platform 500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 500 of the illustrated example includes a processor 512. The processor 512 of the illustrated example is hardware. For example, the processor 512 can be implemented by integrated circuit(s), logic circuit(s), microprocessor(s), GPU(s), DSP(s), or controller(s) from any desired family or manufacturer. The hardware processor may be a semiconductor based (e.g., silicon based) device. In this example, the processor implements the example sensor(s) interface 300, the example current/voltage/resistance processor 302, the example comparator 304, the example resistor configuration determiner 306, and/or the example switch drivers 308.

The processor 512 of the illustrated example includes or is connected to a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface standard, such as an Ethernet interface, a universal serial bus (USB), a Bluetooth® interface, a near field communication (NFC) interface, and/or a PCI express interface.

In the illustrated example, an input device 522 or multiple input devices 522 are connected to the interface circuit 520. The input device(s) 522 permit(s) a user to enter data and/or commands into the processor 512. The input device(s) can be implemented by, for example, an audio sensor, a microphone, a camera (still or video), a keyboard, a button, a mouse, a touchscreen, a track-pad, a trackball, isopoint and/or a voice recognition system.

An output device 524 or multiple output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes a mass storage devices 528 or multiple mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIG. 4 may be stored in the mass storage device 528, in the volatile memory 514, in the non-volatile memory 516, and/or on a removable non-transitory computer readable storage medium such as a CD or DVD.

An apparatus to provide an adaptive connection of a resistive element and a temperature-dependent resistive element is disclosed. Example 1 includes an apparatus to provide an adaptive connection of a resistive element and a temperature-dependent resistive element, the apparatus comprising a temperature-dependent resistive element, a resistive element, a switch coupled to the temperature-dependent resistive element and the resistive element, a current sensor to measure a current through the temperature-dependent resistive element, and a processor to control the switch to, based on the measured current, (a) couple the temperature-dependent resistive element in parallel to the resistive element or (b) couple the temperature-dependent resistive element in series with the resistive element.

Example 2 includes the apparatus of example 1, wherein the processor is to compare the measured current to a threshold, control the switch to couple the temperature-dependent resistive element in series with the resistive element when the measured current does not exceed the threshold, and control the switch to couple the temperature-dependent resistive element in parallel with the resistive element when the measured current exceeds the threshold.

Example 3 includes the apparatus of example 1, wherein the processor is to determine a resistance of the temperature-dependent resistive element based on the measured current.

Example 4 includes the apparatus of example 3, wherein the processor is to compare the determined resistance to a threshold, control the switch to couple the temperature-dependent resistive element in series with the resistive element when the determined resistance does not exceed the threshold, and control the switch to couple the temperature-dependent resistive element in parallel with the resistive element when the determined resistance exceeds the threshold.

Example 5 includes the apparatus of example 1, wherein the temperature-dependent resistive element is a halogen lamp element and the resistive element is a resistive heater.

Example 6 includes a non-transitory computer readable storage medium comprising instructions which, when executed by a processor, cause the processor to determine a current through a temperature-dependent resistive element, and based on the current, control a switch to (a) couple the temperature-dependent resistive element in parallel to a resistive element or (b) couple the temperature-dependent resistive element in series with the resistive element.

Example 7 includes the computer readable storage medium of example 6, wherein the instructions cause the processor to compare the measured current to a threshold, control the switch to couple the temperature-dependent resistive element in series with the resistive element when the measured current does not exceed the threshold, and control the switch to couple the temperature-dependent resistive element in parallel with the resistive element when the measured current exceeds the threshold.

Example 8 includes the computer readable storage medium of example 6, wherein the instructions cause the processor to determine a resistance of the temperature-dependent resistive element based on the measured current.

Example 9 includes the computer readable storage medium of example 8, wherein the instructions cause the processor to compare the determined resistance to a threshold, control the switch to couple the temperature-dependent resistive element in series with the resistive element when the determined resistance does not exceed the threshold, and control the switch to couple the temperature-dependent resistive element in parallel with the resistive element when the determined resistance exceeds the threshold.

Example 10 includes the computer readable storage medium of example 8, wherein the temperature-dependent resistive element is a halogen lamp and the resistive element is a resistive heater.

Example 11 includes an apparatus to provide an adaptive connection of a resistive element and a temperature-dependent resistive element, the apparatus comprising switch drivers to configure a temperature-dependent resistive element and a resistive element in a series configuration, a comparator to determine whether a signal corresponding to current through the temperature-dependent resistive element exceeds a threshold, and the switch drivers to, when the signal exceeds the threshold, configure the temperature-dependent resistive element and the resistive element in a parallel configuration or an independently controllable configuration Example 12 includes the apparatus of example 11, wherein the threshold corresponds an amount of current or a resistance.

Example 13 includes the apparatus of example 11, wherein the signal corresponds to resistance of the temperature-dependent resistive element, further including a resistance processor to determine the resistance based on the signal.

Example 14 includes the apparatus of example 11, wherein the switch drivers are to configure the temperature-dependent resistive element and the resistive element in a series configuration or a parallel configuration by applying a first voltage to a first switch and a second voltage to a second switch, the first and second switches coupled to the temperature-dependent resistive element and the resistive element.

Example 15 includes the apparatus of example 11, further including an interface to obtain the signal from a current sensor.

Example methods, apparatus, and articles of manufacture disclosed herein provide an adaptive connection of resistive elements and temperature-dependent resistive elements. For example, examples disclosed herein monitor current flow through a temperature-dependent resistive element to determine whether to couple the temperature-dependent resistive element in series with a resistor to reduce a current peak, thereby eliminating undesired behavior corresponding to a high inrush of current. By adjusting from a series connection to a parallel or independent connection, examples disclosed herein increase the efficiency of some techniques by monitoring the current through the temperature-variable resistance element and/or determining the resistance of the temperature-variable resistance element. In this manner, a series connection may be used to reduce peak current by increasing overall resistance of the circuit, thereby reducing inrush current. When the current decreases/the resistance increases, the series connection is no longer needed and a parallel or individually controllable connection is established. In this manner, examples disclosed herein provide a faster time to warm up the temperature-dependent resistive elements (e.g., by adjusting from series to parallel quicker) and reduce flicker and CE when the peak current would be high (e.g., by adjusting from series to parallel slower), corresponding to performance-based tuning. Additionally, because phase control is no longer needed, there is no need to utilize AC line filters to filter out inrush current, thereby reducing cost and enabling a smaller product.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to provide an adaptive connection of a resistive element and a temperature-dependent resistive element, the apparatus comprising:
   the temperature-dependent resistive element;
   the resistive element;
   a switch coupled to the temperature-dependent resistive element and the resistive element;
   a current sensor to measure a current through the temperature-dependent resistive element; and a processor, wherein the processor is to:
   compare the measured current to a threshold;
   control the switch to couple the temperature-dependent resistive element in series with the resistive element responsive to the measured current not exceeding the threshold; and
   control the switch to couple the temperature-dependent resistive element in parallel with the resistive element responsive to the measured current exceeding the threshold.

2. The apparatus of claim 1, wherein the threshold corresponds to a current threshold.

3. The apparatus of claim 1, wherein the processor is to determine a resistance of the temperature-dependent resistive element based on the measured current.

4. The apparatus of claim 3, wherein the threshold corresponds to a resistance threshold and the processor is to compare the determined resistance to the resistance threshold.

5. The apparatus of claim 1, wherein the temperature-dependent resistive element is a halogen lamp element and the resistive element is a resistive heater.

6. A non-transitory computer readable storage medium comprising instructions which, when executed by a processor, cause the processor to:
   determine a current through a temperature-dependent resistive element;
   compare the determined current to a threshold;
   control a switch to couple the temperature-dependent resistive element in series with a resistive element responsive to the determined current not exceeding the threshold; and
   control the switch to couple the temperature-dependent resistive element in parallel with the resistive element responsive to the determined current exceeding the threshold.

7. The computer readable storage medium of claim 6, wherein the instructions cause the processor to determine the threshold corresponds to an amount of current.

8. The computer readable storage medium of claim 6, wherein the instructions cause the processor to determine a resistance of the temperature-dependent resistive element based on the determined current.

9. The computer readable storage medium of claim 8, wherein the instructions cause the processor to compare the determined resistance to the threshold, wherein the threshold corresponds to a resistance threshold.

10. The computer readable storage medium of claim 6, wherein the temperature-dependent resistive element is a halogen lamp and the resistive element is a resistive heater.

11. An apparatus to provide an adaptive connection of a resistive element and a temperature-dependent resistive element, the apparatus comprising:
   switch drivers to configure a temperature-dependent resistive element and a resistive element in a series configuration; and
   a comparator to determine whether a signal corresponding to a current through the temperature-dependent resistive element exceeds a threshold, wherein the switch drivers are to configure, in response to the signal exceeding the threshold, the temperature-dependent resistive element and the resistive element in a parallel configuration or an independently controllable configuration.

12. The apparatus of claim 11, wherein the threshold corresponds to a resistance threshold.

13. The apparatus of claim 12, wherein the signal corresponds to a resistance of the temperature-dependent resistive element, further including a resistance processor to determine the resistance based on the signal.

14. The apparatus of claim 11, wherein the threshold corresponds to an amount of current.

15. The apparatus of claim 14, wherein the comparator is to, responsive to the switch drivers configuring the temperature-dependent resistive element and the resistive element in a series configuration, determine whether the signal exceeds the threshold after a preset delay.

16. The apparatus of claim 1, wherein a resistance of the resistive element is higher than a resistance of the temperature-dependent resistive element while the temperature-dependent resistive element is below a temperature threshold.

17. The apparatus of claim 11, wherein the threshold corresponds to a voltage ratio threshold.

18. The apparatus of claim 16, wherein the signal corresponds to a voltage ratio between an amount of voltage measured across the temperature-dependent resistive element and a full line voltage.

* * * * *